United States Patent
Subramaniam et al.

(10) Patent No.: US 10,044,373 B2
(45) Date of Patent: Aug. 7, 2018

(54) OPTIMIZED ACM TRAJECTORY SYSTEMS AND METHODS

(71) Applicant: Hughes Network Systems, LLC, Germantown, MD (US)

(72) Inventors: Bala Subramaniam, Potomac, MD (US); Yanlai Liu, Rockville, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 15/395,943

(22) Filed: Dec. 30, 2016

(65) Prior Publication Data
US 2018/0191380 A1 Jul. 5, 2018

(51) Int. Cl.
| | |
|---|---|
| H03M 13/35 | (2006.01) |
| H03M 13/37 | (2006.01) |
| H03M 13/00 | (2006.01) |
| H04L 1/00 | (2006.01) |
| H04L 5/00 | (2006.01) |
| H04L 12/26 | (2006.01) |
| H03M 13/11 | (2006.01) |

(52) U.S. Cl.
CPC ..... *H03M 13/353* (2013.01); *H03M 13/1102* (2013.01); *H03M 13/356* (2013.01); *H03M 13/3746* (2013.01); *H03M 13/6522* (2013.01); *H04L 1/005* (2013.01); *H04L 1/007* (2013.01); *H04L 5/006* (2013.01); *H04L 43/16* (2013.01)

(58) Field of Classification Search
CPC ........... H03M 13/353; H03M 13/3746; H03M 13/6522; H04L 1/005; H04L 1/007
See application file for complete search history.

(56) References Cited

U.S. PATENT DOCUMENTS

| | | | | |
|---|---|---|---|---|
| 2003/0126536 A1* | 7/2003 | Gollamudi | ............ | H04L 1/0003 714/748 |
| 2003/0236074 A1* | 12/2003 | Ishii | ..................... | H04B 1/7113 455/69 |
| 2004/0248520 A1* | 12/2004 | Miyoshi | ............... | H04B 7/2659 455/67.13 |
| 2007/0298728 A1* | 12/2007 | Imamura | ............... | H04L 5/0046 455/77 |

(Continued)

OTHER PUBLICATIONS

E. Casini, R. De Gaudenzi and A. Ginesi, DVB-S2 modem algorithms design and performance over typical satellite channels, International Journal of Satellite Communications and Networking. 2004; vol. 22: pp. 281-318 (Year: 2004).*

(Continued)

*Primary Examiner* — Joseph D Torres
(74) *Attorney, Agent, or Firm* — Sheppard, Mullin, Richter & Hampton LLP; Daniel Yannuzzi

(57) ABSTRACT

Systems and methods for ACM trajectory include receiving data at a communications receiver; decoding the received data based on a selected MODCOD; monitoring a number of iterations used to decode the data using the selected MODCOD; comparing the number of iterations used to decode the data using the first selected MODCOD to a reference number of iterations; and adjusting a SNR threshold value for the selected MODCOD where the number of iterations used to decode the data using the first selected MODCOD is greater than the reference number of iterations.

12 Claims, 10 Drawing Sheets

(56) References Cited

U.S. PATENT DOCUMENTS

| | | | |
|---|---|---|---|
| 2008/0163002 A1* | 7/2008 | Frederiksen | H04L 1/0046 |
| | | | 714/37 |
| 2008/0274690 A1* | 11/2008 | Laufer | H04B 7/18515 |
| | | | 455/13.4 |
| 2010/0046415 A1* | 2/2010 | Kim | H03M 13/2957 |
| | | | 370/315 |
| 2010/0128821 A1* | 5/2010 | Kim | H04L 27/2655 |
| | | | 375/340 |
| 2010/0150037 A1* | 6/2010 | Becker | H04B 7/18504 |
| | | | 370/310 |
| 2010/0272011 A1 | 10/2010 | Palanki | |
| 2011/0003543 A1* | 1/2011 | Laufer | H04B 7/212 |
| | | | 455/3.02 |
| 2015/0095726 A1 | 4/2015 | Cameron | |
| 2016/0233979 A1 | 8/2016 | Koike-Akino | |

OTHER PUBLICATIONS

Richard Miller, Adaptive Coding and Modulation (ACM) in the CDM-625 Advanced Satellite Modem, 2009 Comtech EF Data Corporation, 2009, pp. 1-14 (Year: 2009).*

International Search Report and Written Opinion for PCT/US2017/068797 dated Apr. 17, 2018, 75 pages.

\* cited by examiner

TABLE OF LDPC ITERATIONS BASED ON
CCM (NO BORROWING) 485

| MODCOD | ITERATIONS |
|---|---|
| 170 | 12 |
| 172 | 13 |
| 168 | 15 |
| 174 | 17 |

TABLE OF AVERAGE # OF
ITERATIONS 484

| MODCOD | ITERATIONS |
|---|---|
| 170 | |
| 172 | |
| 168 | |
| 174 | |

ACM TRAJECTORY
TABLE 483

| MODCOD | SNR | ADJUST |
|---|---|---|
| 170 | 8.7 | |
| 172 | 9.02 | |
| 168 | 9.37 | 0.05 |
| 174 | 9.42 | |

Fig. 7

1) Init adj=0
2) snr=9.37, adj+snr=9.37
3) TargetMC=168, AdjTargetMC=168
4) If reportIter_168<=17, back to 1)
5) If reportIter_168>17, adj=0.05
6) snr=9.37, adj+snr=9.42
7) TargetMC=168, AdjTargetMC=174
8) If reportIter_174<=19, check
   if reportIter_168>17, adj=0.05, back to 6)
   if reportIter_168<=17, back to 1)
9) If reportIter_174>19, adj=0.1
10) snr=9.37, adj+snr=9.47
11) TargetMC=168, AdjTargetMC=new
12) Repeat 8)

Fig. 9

OPTIMIZED ACM TRAJECTORY SYSTEMS AND METHODS

TECHNICAL FIELD

The disclosed technology relates generally to communication systems, and more particularly, some embodiments relate to systems and methods for modulation and coding selection.

DESCRIPTION OF THE RELATED ART

Contemporary communication technologies provide enhanced multimedia services (e.g., voice, data, video, etc.) to end-users over various delivery platforms, including terrestrial wire-line, fiber and wireless communications and networking technologies, and satellite communications and networking technologies. The relatively recent proliferation of mobile communications has spurred growth in the demand for such enhanced multimedia services over mobile communications networks (both terrestrial and satellite based). As part of the continued evolution of such communications platforms and supporting technologies, the Digital Video Broadcasting (DVB) organization was formed (as an industry-led, global consortium of broadcasters, manufacturers, network operators, software developers, regulatory bodies and others) to advance the design of open interoperable standards for the global delivery of digital media and broadcast services.

The DVB-S2 standard is a digital satellite transmission system standard covering a variety of data and multimedia services delivered over satellite communications systems. The DVB-S2 standard also covers various technological features, such as a flexible input stream adapter (suitable for operation with single and multiple input streams of various formats), a robust Forward Error Correction (FEC) coding system based on Low-Density Parity Check (LDPC) codes concatenated with Bose Chaudhuri Hocquenghem (BCH) codes, a wide range of code rates (from ¼ up to 9/10), four signal constellations (ranging in spectrum efficiency from 2 bit/s/Hz to 5 bit/s/Hz), and Adaptive Coding and Modulation (ACM) functionality (optimizing channel coding and modulation on a frame-by-frame basis).

The DVB-S2 standard on the forward link uses LDPC for FEC. The forward link uses ACM (Adaptive Coded Modulation) scheme proposed in DVB-S2 standard. ACM improves capacity on the forward link by transmitting the frames to the terminal using the modulation and coding method that matches the channel conditions. The modulation and coding, sometimes referred to as MODCOD, varies depending on the channel conditions such as clear sky, rain etc.

BRIEF SUMMARY OF EMBODIMENTS

According to various embodiments of the disclosed technology a demodulator of a communication receiver computes the SNR on received, which can be done based on header information. The SNR is generally independent of MODCODs. A software processor selects the target MODCOD based on the SNR and stored trajectory information. In various embodiments, the terminal requests the Gateway to send information using the target MODCOD and the target MODCOD can be sent to a Code Block Selector to drop data with a MODCOD above the target MODCOD at the terminal. A decoder can be provided to decode the filtered frames, monitor the number of iterations taken by the target MODCOD and maintain a weighted average over a configurable interval to determine a reported iteration for the target MODCOD. If the reported iteration of the target MODCOD is the same as or less than the predetermined reference iteration, this implies the frame is early terminated, and the real SNR is higher than the estimated. No adjustment is applied to the ACM trajectory information and the terminal continues to estimate the SNR and compute new target MODCODs for data received.

If the reported iteration of the target MODCOD is more than the reference iteration, this may be an indication that iteration borrowing happens on the target MODCOD. In this case the terminal can be configured to request a higher MODCOD for data transmission. In some embodiments, an SNR threshold value for each said available MODCOD is stored in memory and adjusted by further storing an SNR adjustment value for the selected MODCOD. In other embodiments, the SNR threshold value stored for the selected MODCOD is adjusted.

In some embodiments, to maintain hysteresis, the reported number of iterations must be greater than the number of reference iterations by a configurable number (e.g., 2), before the terminal adjusts ACM trajectory data. If the extra iteration gained on the target MODCOD is more than the configurable number, the terminal can be configured to shift its ACM trajectory information by a given amount. In some embodiments, this amount can be, for example, 0.05 dB. This is done by adding this amount to the estimated SNR when the new the target MODCOD is selected. The MODCOD selection process can be repeated with the new target MODCOD.

In various embodiments a communication apparatus can include: a demodulator; a MODCOD determination block comprising an input coupled to a demodulator and an output, wherein the MODCOD determination block is configured to determine a selected MODCOD for receiver operation using a SNR determined for received data; a memory associated with the MODCOD determination block to store trajectory data comprising available MODCODs and a threshold SNR for the available MODCODs; a decoder comprising an input coupled to an output of the demodulator; a memory associated with the decoder to store a reference number of decoder iterations used to decode data using the selected MODCOD and an actual number of decoder iterations used to decode data using the selected MODCOD; wherein the decoder is configured to adjust the threshold SNR for the selected MODCOD if the number of iterations used to decode the data using the first selected MODCOD is greater than the reference number of iterations. In various embodiments, a SNR estimation block having an input coupled to the demodulator and an output coupled to the MODCOD determination block can be included. The SNR estimation block may be configured to determine a signal-to-noise ratio (SNR) for the received data.

The communication apparatus may further include a code block selector comprising an input coupled to the demodulator and an output coupled to the decoder, where in the code block selector is configured to filter the received code blocks based on the selected MODCOD.

In various embodiments, determining the selected MODCOD may include determining a MODCOD that will operate under the determined SNR. The threshold SNR for each MODCOD may correspond to a threshold Frame Error Rate specified by a network over which the data is received.

In some applications, the memory associated with the MODCOD determination block may include an SNR adjustment amount, and adjusting a SNR threshold value for the selected MODCOD may include modifying an SNR adjustment amount in the table of two or more available MODCODs. In other applications, adjusting a SNR threshold value for the selected MODCOD comprises shifting the SNR threshold values of one or more available MODCODs by a determined amount. Determining the selected MODCOD may include determining a MODCOD that will operate under the determined SNR using one or more adjusted SNR threshold values for one or more available MODCODs.

In still further embodiments, a method for ACM communication, may include receiving data at a communications receiver; decoding the received data based on a selected MODCOD; monitoring a number of iterations used to decode the data using the selected MODCOD; comparing the number of iterations used to decode the data using the first selected MODCOD to a reference number of iterations; and adjusting a required SNR threshold value for the selected MODCOD where the number of iterations used to decode the data using the first selected MODCOD is greater than the reference number of iterations. The operation may further include determining a signal-to-noise ratio (SNR) for the received data and selecting the MODCOD based on the determined SNR. In some applications, selecting the MODCOD may include determining a MODCOD that will operate under the determined SNR.

In various embodiments, the process may further include maintaining a table of two or more available MODCODs and an SNR threshold value for said available MODCOD, wherein selecting the MODCOD comprises selecting a MODCOD that will operate under the determined SNR. In some applications, the threshold SNR for each MODCOD may correspond to a threshold Frame Error Rate specified by a network over which the data is received. Adjusting a SNR threshold value for the selected MODCOD may include modifying an SNR adjustment amount in the table of two or more available MODCODs. In other embodiments, adjusting a SNR threshold value for the selected MODCOD may include shifting the SNR threshold values in the table of two or more available MODCODs by a determined amount. Selecting the MODCOD may include determining a MODCOD that will operate under the determined SNR using one or more adjusted SNR threshold values for one or more available MODCODs.

The may further include storing a reference number of iterations without iteration borrowing or early termination for available MODCODs; and determining an average number of actual iterations required for decoding using the selected MODCOD; wherein comparing may include comparing the determined average number of actual iterations to the stored reference number of iterations.

In some embodiments, the process further includes storing an identification of two or more available MODCODs and an SNR threshold value for each said available MODCOD, and adjusting a SNR threshold value for the selected MODCOD includes further storing an SNR adjustment value for the selected MODCOD. In other embodiments, adjusting a SNR threshold value for the selected MODCOD comprises adjusting the value stored for the SNR threshold of the selected MODCOD.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 7 is a diagram illustrating example tables that can be used in accordance with various embodiments of the systems and methods described herein.

FIGS. 8 and 9 are flow diagrams illustrating an example operation of the systems and methods described in FIGS. 5, 6 and 7 in accordance with one embodiment.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

In various embodiments of the technology disclosed herein, a terminal estimates the forward link Signal-to-Noise Ratio (SNR) based on the unique word headers present in each frame. The terminal may be configured to maintain and update an ACM trajectory table that lists possible forward link MODCODs and a corresponding SNR threshold value associated with each of the MODCODs. The SNR for each combination of modulation and coding schemes corresponds to the threshold Frame Error Rate specified by the communication network on which the system is implemented (e.g., a VSAT network). The terminal, based on the estimated SNR, may request the Gateway to transmit frames using a target MODCOD that corresponds to the target SNR as set forth in the ACM trajectory table. The Gateway then transmits frames to this terminal using MODCOD's having an SNR at the target MODCOD or lower. MODCOD's lower than the target MODCOD are more robust and requires lower SNR.

During decoding operations, an actual number of iterations can be tracked for decoding using the target MODCOD. Where the number of iterations is less than or equal to a determined threshold, this can indicate that the SNR is sufficient for the communication using the target MODCOD. In some embodiments, the threshold can be a reference number of iterations defined for the target MODCOD. On the other hand, if the number of iterations used for decoding is greater than this threshold, the ACM trajectory table can be updated to indicate a lower level of SNR is required for that MODCOD. Accordingly, in future iterations the adjusted SNR can be considered in determining and selecting the target MODCOD for communications given an estimated SNR of the communication link. In some applications, using adjusted SNR values in determining and selecting the target MODCOD for communications can potentially increase the VSAT capacity.

Figure 1:
FIG. 1 illustrates an example communication system in which various embodiments of the disclosure may be implemented.

FIG. 1 is a diagram illustrating an example communication system capable of employing modulation and coding protocols, in accordance with various embodiments of the systems and methods disclosed herein. With reference to FIG. 1, this example communications system includes one or more transmitters 101 (of which one is shown) that generate signals for transmission to one or more receivers 103 (of which one is shown) across a communication channel 102. Communication channel 102 may comprise, for example, one or more channels of a wired or wireless communication link. One example communication channel 102 may be a satellite communications system. Transmitter 101 may include a signal source that produces data signals modulated onto a signal waveform. In some applications, the data, or information may be encoded (e.g., via a forward error correction (FEC) code) enhance data reliability by introducing redundant data prior to data transmission. Once encoded, the encoded information may then be modulated onto a carrier for transmission over the channel 102.

FEC is used in terrestrial and satellite systems to provide high quality communication over a radio frequency (RF) propagation channel, which introduces signal waveform and spectrum distortions, including signal attenuation, multipath induced fading and adjacent channel interference. These impairments influence the design of the radio transmission and receiver equipment, including modulation schemes, error control schemes, and demodulation and decoding techniques to name a few.

Figure 2:
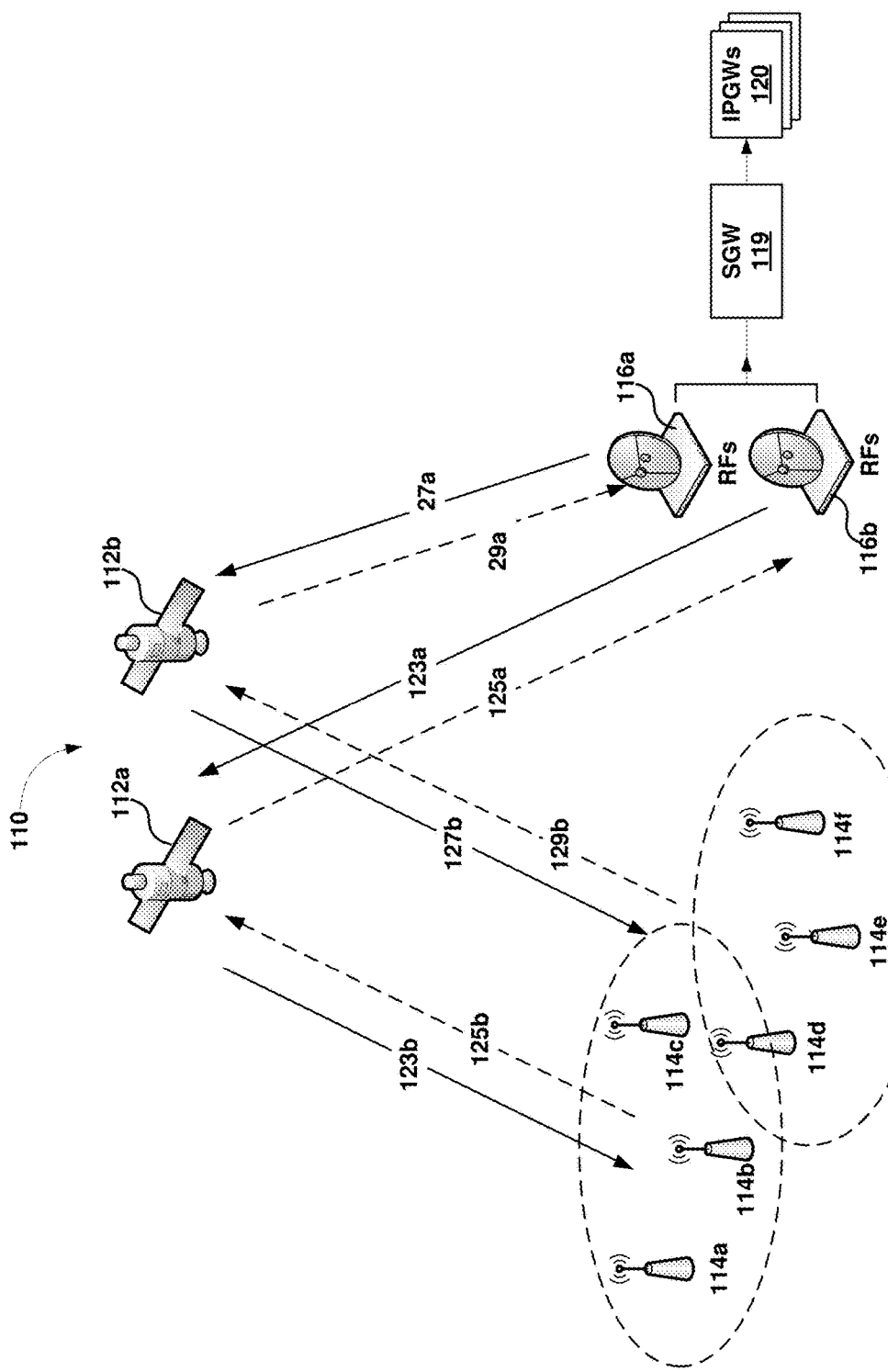
FIG. 2 illustrates an example multi-satellite data transmission system in which various embodiments of the disclosure may be implemented.

FIG. 2 illustrates an example satellite network in which various embodiments of the technology disclosed herein may be implemented. Satellite network 110 in this example can include multiple satellites 112a and 112b, remote terminals 114a-114f, radio frequency (RF) terminals 116a and 116b, satellite gateway (SGW) 119, and IP gateways (IPGWs) 120. The satellite network may be a shared access broadband network. Other types of shared access networks may include, for example, wireless networks such as 4th Generation Long Term Evolution (4G LTE) and WiMAX networks, which may include terminals other than VSATs, such as cellular and WiFi equipped devices.

Feeder links may carry data between RF terminals 116a and 116b and satellites 112a and 112b, and may include: forward uplinks 123a and 127a for transmitting data from RF terminals 116a and 116b to satellites 112a and 112b, respectively; and return downlinks 125a and 129a for transmitting data from satellites 112a and 112b, respectively, to RF terminals 116a and 116b. User links may carry data between satellites 112a and 112b and remote terminals 114a-114f, and may include: return uplinks 125b and 129b for transmitting data from remote terminals 114a-114f to satellites 112a and 112b, respectively; and forward downlinks 123b and 127b for transmitting data from satellites 112a and 112b, respectively, to remote terminals 114a-114f. Forward uplinks 123a, 127a and forward downlinks 123b, 127b may form an outroute, and return uplinks 125b, 129b and return downlinks 125a, 129a may form an inroute. SGW 119 may include high capacity earth stations with connectivity to ground telecommunications infrastructure. SGW 119 may be communicatively connected to RF terminals 116a and 116b. RF terminals 116a and 116b may be the physical equipment responsible for sending and receiving signals to and from satellites 112a and 112b, respectively, and may provide air interfaces for SGW 119/IPGWs 120.

Satellites 112a and 112b may be any suitable communications satellites. For example, satellites 112a and 112b may be bent-pipe design geostationary satellites, which can accommodate innovations and variations in transmission parameters, operating in the Ka-band, Ku-band, or C-band. Satellites 112a and 112b may use one or more spot beams as well as frequency and polarization reuse to maximize the total capacity of satellite network 110. Signals passing through satellites 112a and/or 112b in the forward direction may be based on the DVB-S2 standard (ETSI EN 302 307) using signal constellations up to and including at least 32-APSK. The signals intended to pass through satellites 112a and 112b in the return direction (from terminals 114a-114f) may be based on the Internet Protocol over Satellite (IPoS) standard (ETSI TS 102 354). Other suitable signal types may also be used in either direction, including, for example higher data rate variations of DVB-S2.

IPGWs 120 may be an ingress portion of a local network. IP traffic, including TCP traffic, from the internet may enter an SGW 119 through IPGWs 120. IPGWs 120 may each include a spoofer, which may acknowledge IP traffic, including TCP traffic sent to SGW 119. Moreover, SGW 119 may be connected to an internet through IPGWs 120. IP traffic, including TCP traffic, from the internet may enter SGW 119 through IPGWs 120. As illustrated in FIG. 1, multiple IPGWs may be connected to a single IGM. The bandwidth of RF terminals 116a and 116b can be shared amongst IPGWs 120. At each of IPGWs 120, real-time (RT) and NRT traffic flows may be classified into different priorities. These traffic flows may be processed and multiplexed before being forwarded to priority queues at SGW 119. RT traffic may go directly to an RT priority queue or SGW 119, while NRT traffic flows may be serviced based on the respective priority and volume. Data may be further packed into DVB-S2 code blocks and stored in a code block buffer before transmission.

Data from the internet intended for remote terminals 114a-114f (e.g., VSATs) may be in the form of IP packets, including TCP packets and UDP packets, or any other suitable IP packets, and may enter SGW 119 at any one of IPGWs 120, where the respective spoofer may send an acknowledgment back to the sender of the IP packets. The IP packets may be processed and multiplexed by SGW 119 along with IP packets from other IPGWs, where the IPGWs may or may not have the same service capabilities and relative priorities. The IP packets may then be transmitted to satellites 112a and 112b on forward uplinks 123a and 127a using the air interfaces provided by RF terminals 116a and 116b. Satellites 112a and 112b may then transmit the IP packets to the VSATs using forward downlinks 123b and 127b. Similarly, IP packets may enter the network via the VSATs, be processed by the VSATs, and transmitted to satellites 112a and 112b on return uplinks 125b and 129b. Satellites 112a and 112b may then send these inroute IP packets to the SGW 119/IPGWs 120 using return downlinks 125a and 129a.

Each of remote terminals 114a-114f may connect to the Internet through satellites 112a and 112b and IPGWs 120/SGW 119. For example, remote terminal 114a may be used at a residence or place of business to provide a user with access to the Internet. VSATs or Mobile Satellite Terminals (MSTs), as previously described, may be used by end users to access the satellite network, and may include a remote satellite dish antenna for receiving RF signals from and transmitting RF signals to satellite 112a, as well as a satellite modem and other equipment for managing the sending and receiving of data. They may also include one or more remote hosts, which may be computer systems or other electronic devices capable of network communications at a site.

Figure 3:
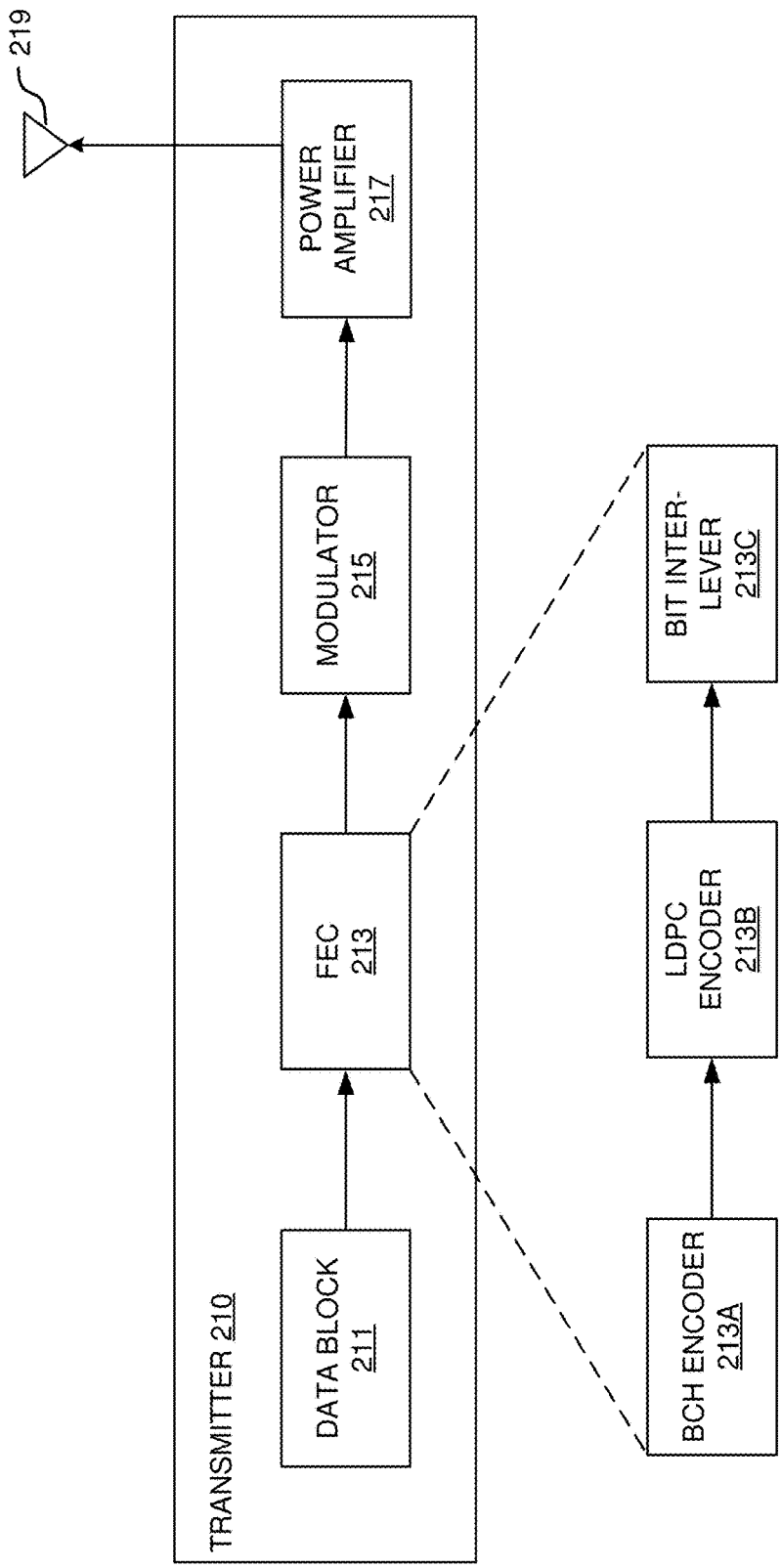
FIG. 3 illustrates a block diagram of an example transmitter as may be configured to operate in the systems of FIGS. 1 and 2, in accordance with one embodiment of the systems and methods disclosed herein.

FIG. 3 illustrates a block diagram of an example transmitter as may be configured to operate in the systems of FIGS. 1 and 2, in accordance with one embodiment of the systems and methods disclosed herein. With reference to FIG. 3, the transmitter 210 is equipped with a data encapsulation block 211 that accepts the original application layer source data and performs the upper layer encapsulation to from the baseband frames. The encoder (e.g., a FEC encoder) 213 receives the baseband frames from the data encapsulation module 211, and outputs a coded data stream. As noted above, with FEC, this data can have a higher redundancy as may be suitable for error correction processing at the receiver. The encoded signal is fed to the modulator 215, which modulates the data onto signal waveforms. The modulated signal is amplified by power amplifier 217 and transmitted via the transmit antenna 219, over the communication channel to the satellite.

Figure 4:
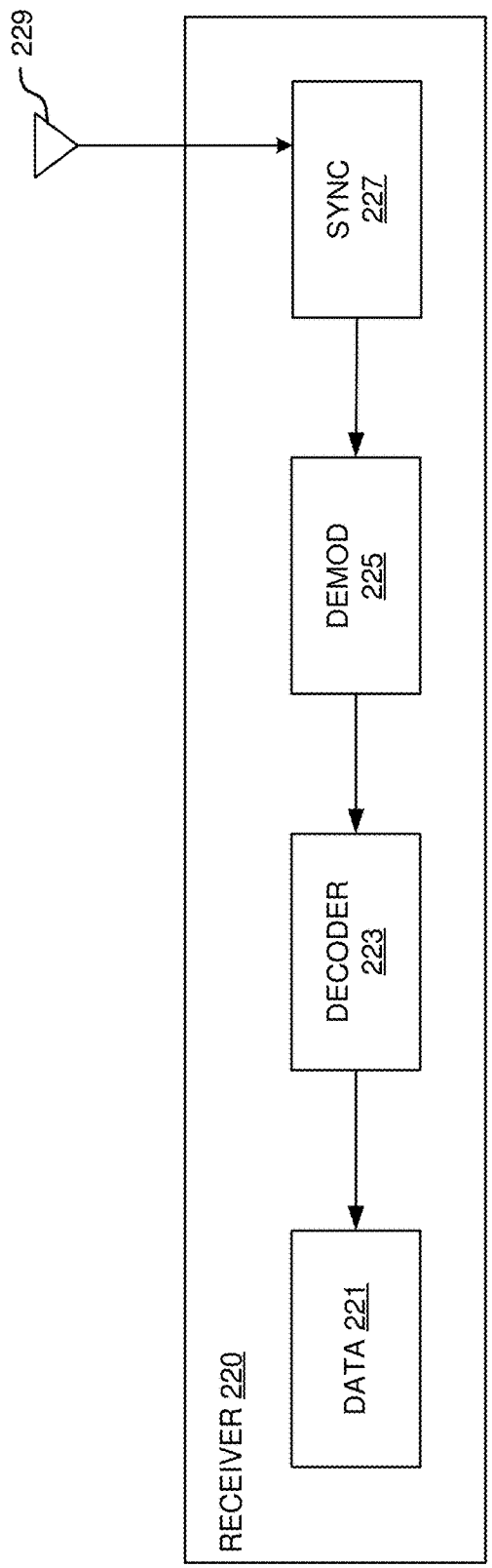
FIG. 4 illustrates a block diagram of an example receiver as may be configured to operate in the systems of FIGS. 1 and 2, in accordance with one embodiment of the systems and methods disclosed herein.

FIG. 4 illustrates a block diagram of an example receiver as may be configured to operate in the systems of FIGS. 1 and 2, in accordance with one embodiment of the systems and methods disclosed herein. With reference to FIG. 4, the receiver 220 comprises receive antenna 229, sync block 227 demodulator 225, decoder 223 and data de-encapsulation block 221. The receive antenna 229 receives the signal waveform transmitted over the channel 114 from the satellite 121. The sync module 227 detects the unique word, performs synchronization and determines the MODCOD and other signaling which can be determined, for example, based on header information. The demodulator 225 demodulates the received signal waveforms to obtain the encoded data. The decoder 223 then decodes the demodulated bit sequence to generate an estimate of the encapsulated message, and the de-encapsulation block 221 de-encapsulates the message data to regenerate an estimate of the original source data.

The technology is described herein from time to time in the context of this example communication system in FIGS. 1-4. This is done merely to provide context for the description is in no way limiting of the applicability of the disclosed technology to this example system. Indeed, after reading the description of the technology included herein, one of ordinary skill in the art will understand how to implement the technology in other communication systems.

Figure 5:
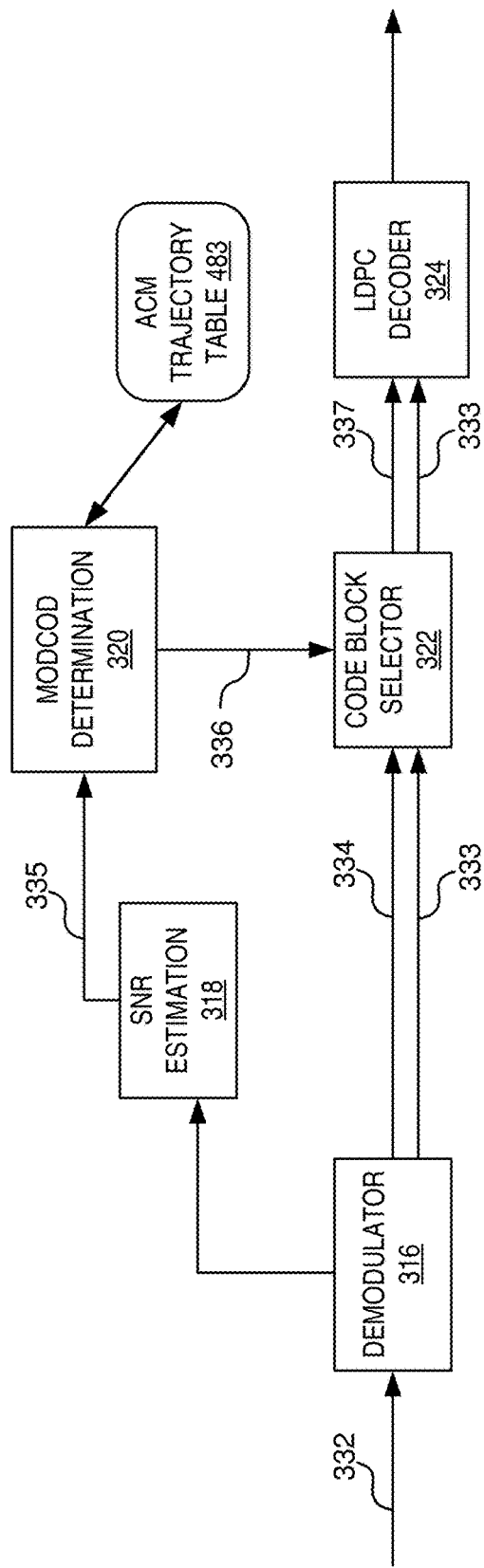
FIG. 5 is a functional block diagram illustrating an example implementation for optimizing ACM in accordance with one embodiment of the systems and methods described herein.
Figure 6:
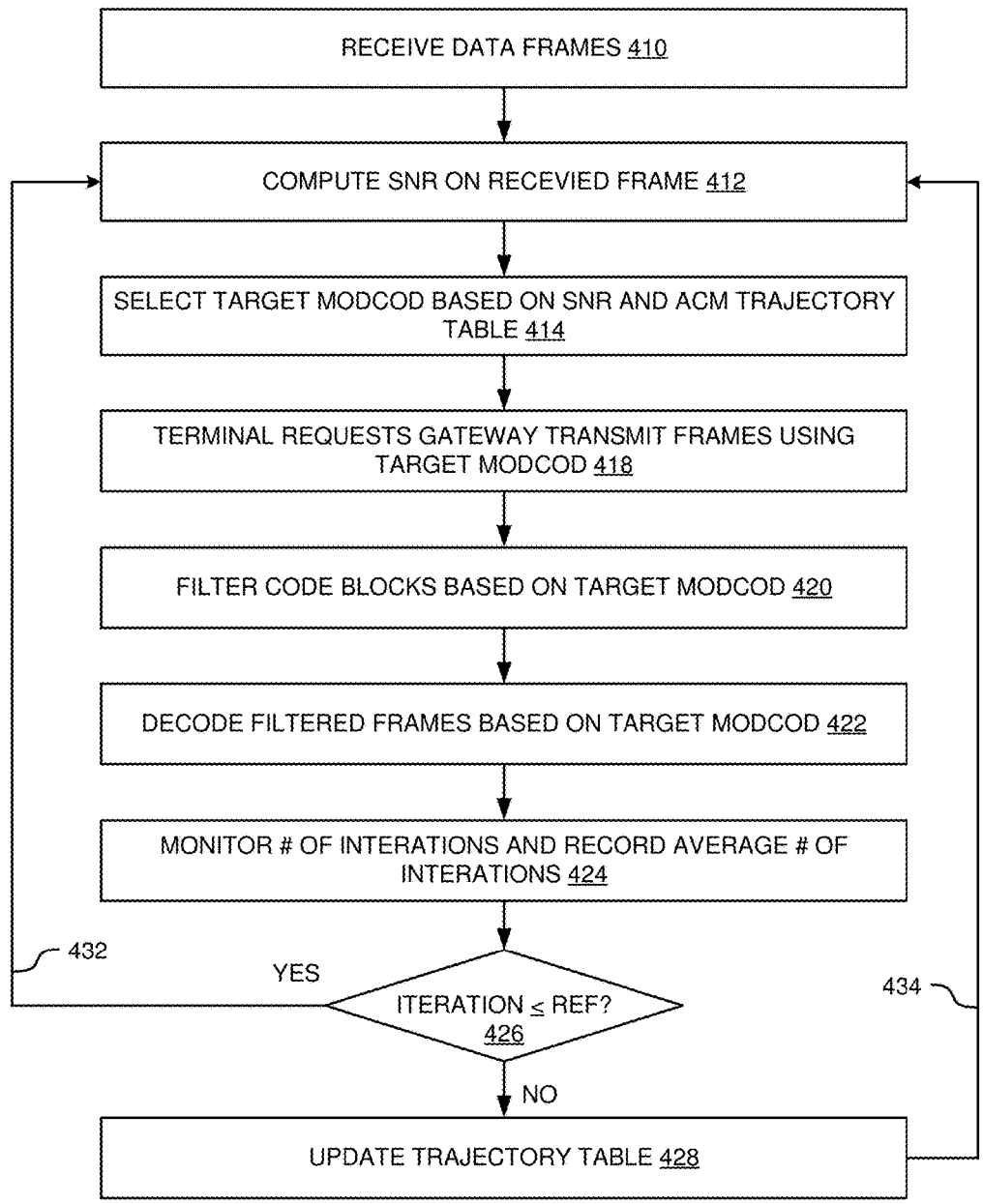
FIG. 6 illustrates an example process for optimizing ACM in accordance with one embodiment of the systems and methods described herein.

FIG. 5 is a functional block diagram illustrating an example implementation for optimizing ACM in accordance with one embodiment of the systems and methods described herein. FIG. 6 illustrates an example process for optimizing ACM in accordance with one embodiment of the systems and methods described herein. FIG. 7 is a diagram illustrating example tables that can be used in accordance with various embodiments of the systems and methods described herein. Referring now to FIGS. 5, 6 & 7, at operation 410 data frames 332 are received at the receiver. Upon receipt, demodulator 316 demodulates the forward link carrier and outputs the demodulated data. In examples implemented in accordance with DVB, demodulator 316 outputs DVB-S2 frames 334. Each DVD-S2 frame has an associated modulation and coding scheme (i.e., MODCOD) 333. The MODCOD 333 is also identified and output by demodulator 316.

At operation 412, an SNR estimation block 318 computes the signal-to-noise ratio (SNR) for each received DVB-S2 frame. In some embodiments, this can be done by the demodulator. The SNR 335 can be identified, for example, using unique word headers in each frame. The SNR 335 is provided to a MODCOD determination block 320.

At operation 414, the terminal determines a target MODCOD 336 using the SNR 335. In some embodiments, the terminal maintains an ACM trajectory table 483 (FIG. 7) that lists the possible forward link MODCOD choices and the corresponding SNR threshold value for each MODCOD. The required SNR for each combination of MODCOD may, in some embodiments, correspond to the threshold Frame Error Rate specified by the network. From ACM trajectory table 483, the terminal determines a target MODCOD 336 that will operate under the determined SNR. Generally, a MODCOD with a higher SNR threshold has more efficiency. Therefore, the terminal may try to request as high a MODCOD as possible, given the SNR. Consider for example, a circumstance in which SNR estimation block 318 computes the SNR at 9.40. In this example (ignoring the ADJUST column for this example) MODCOD 168 would be selected as the target MODCOD, because its SNR threshold value is 9.37.

As described below with reference to operations 426 and 428, in some embodiments, ACM trajectory table 483 may be updated with a SNR adjustment amount in the ADJUST column. This can occur, for example, when the LDPC decoder 324 determines that the actual reported number of iterations for a decoding operation is greater than the stored reference number of iterations for that operation using the selected MODCOD (e.g., due to iteration borrowing). Accordingly, in the example of FIG. 7 the ACM trajectory table 483 includes an adjustment of 0.05 dB meaning the terminal can select a MODCOD with the required SNR as 9.42. In such a case, the target MODCOD is selected considering the SNR adjustment amount. Where the adjustment amount affects the selection, an adjusted target MODCOD is selected and provided.

Consider the same example described above in which SNR estimation block 318 computes the SNR at 9.40. In this example (this time considering the ADJUST column) the adjusted SNR is 9.37+0.05=9.42. Based on this adjustment, the terminal requires MODCOD with an SNR of 9.42 dB. Therefore, the decoder would select MODCOD 174, which requires 9.42 dB SNR. This can be referred to as the adjusted target MODCOD.

At operation 418, the terminal requests that the Gateway transmit frames using this target MODCOD 336 (which may an adjusted target MODCOD). In the example illustrated in FIG. 5, MODCOD determination block 320 delivers this target MODCOD 336 to code block Selector 322. The Gateway then transmits frames to this terminal using MODCODs at the target MODCOD 336 or lower. MODCODs lower than target MODCOD 336 (i.e., MODCODs with a lower required SNR) are more robust and do not require as high a SNR to meet the desired performance. MODCODs higher than the target MODCOD (i.e., MODCODs with a higher required SNR) are not as robust and require a higher SNR to meet the desired performance.

At operation 420, code block selector 322 uses the target MODCOD 336 to filter the received data (e.g, to filter DVB-S2 frames that are received). For example, code block Selector 322 can be configured to filter out frames having a MODCOD that are above the target MODCOD 336 (i.e., MODCODs requiring a higher SNR). The remaining code blocks 337 after the filter are sent to the LDPC decoder 324.

The LDPC decoder 324 decodes the filtered frames with MODCODs lower than or equal to the target MODCOD. This is illustrated at operation 422. In DVB embodiments, LDPC Decoder 324 decodes the DVB-S2 code blocks that have been filtered by the Code Block Selector 322. These code blocks have MODCODs that require a SNR at or below the target MODCOD SNR. The LDPC decoder stores the number of LDPC iterations based on constant code modulation (CCM) and without iteration borrowing or early termination. This can be accomplished, for example by maintaining and updating a table of LDPC iterations. An example of this table is illustrated at FIG. 7 as table 485. This number of iterations is stored as a reference number of iterations for the target MODCOD.

In CCM mode, demodulator 316 receives a single MODCOD. In this condition, LDPC decoder 324 can support a specified number of iterations based on the frame length and code parameters. LDPC decoder 324 uses the CCM based iteration table (e.g. table 485) as an input to determine whether to change the ACM trajectory.

As the LDPC decoder receives the filtered code blocks 337, it monitors the number of iterations actually required for decoding, which may include borrowing and early termination. This is illustrated at operation 424. LDPC decoder 324 computes the average number of iterations required to decode each frame and stores this average number as the reported number of iterations. This average can be maintained as a weighted average over a predetermined time frame for a predetermined number of blocks. The period over which the average is taken can be configurable. The average can be stored in a table such as the table of average number of iterations 484 in FIG. 7.

At operation 426, LDPC decoder 324 determines whether the actual reported number of iterations is less than or equal to the stored reference number of iterations. Where the number of reported iterations is less than or equal to the number of reference iterations, this implies that the MODCOD decoding was terminated early and the actual SNR is higher than was estimated. In this circumstance, no adjustment is applied to the ACM trajectory table 483 and the terminal continues to estimate and compute new target MODCODs. This is illustrated by flow line 432.

If, on the other hand, at operation 426 the LDPC decoder 324 determines that the actual reported number of iterations is greater than the stored reference number of iterations, which can arise, for example, where iteration borrowing happens on the target MODCOD and the terminal is able to request a higher MODCOD. Accordingly, at operation 428, LDPC decoder 324 updates ACM trajectory table 483 to reflect the lower level of SNR required for that MODCOD. In some embodiments, the table is updated in 0.05 dB increments, but in other embodiments, other increments are used.

In some embodiments, to maintain hysteresis, the reported difference in iterations must be greater than a determined threshold before the trajectory table is updated. In some embodiments, the actual number of iterations must be more than a predetermined number of iterations greater than the reference number of iterations before the SNR required for that MODCOD is updated. In other words, if the extra iteration(s) gained on the target MODCOD is more than a configurable number, the terminal shifts its ACM trajectory table 483 by the determined SNR level—e.g., by 0.05 dB. In various embodiments, this configurable number of iterations can be set as 1, 2, 3 or more iterations depending on the amount of hysteresis to be introduced.

In some embodiments, this adjustment is accomplished by adding the desired amount (e.g., 0.05 dB) to the estimated SNR when it selects the new target MODCOD. This example of 0.05 dB is shown in the ADJUST column of ACM trajectory table 483, which shows an adjustment of 0.05 dB for the SNR threshold value at the target MODCOD of MODCOD 168. As shown by flow line 434, with the new target MODCOD 336 (updated per the adjustment), the same procedures are applied, except in some embodiments the reported iterations of both target MODCOD and the new target MODCOD may be monitored and tracked.

For example, in one embodiment the actual number of iterations must be at least 2 iterations greater than the reference number of iterations before the SNR required for that MODCOD is updated. In other embodiments, other predetermined numbers can be used to set the thresholds.

When there are more iterations allocated on MODCOD 168 (e.g., due to iteration borrowing), there are alternative approaches to the trajectory table adjustment in the target MODCOD selection. In one embodiment, as discussed above, the ACM trajectory table remains the same, an adjustment (e.g., 0.05 db) is made on the measured SNR, and the system uses the adjusted SNR (e.g., 9.37+0.05=9.42 in the illustrated example) to select the new target MODCOD (will be 174) based on the ACM trajectory table. In another embodiment, the measured SNR remains the same (9.37 dB in the above example) and the trajectory table's SNR threshold value is shifted by a determined amount (e.g., 0.05 dB), i.e., the MODCOD 168 originally has 9.37 dB as a threshold, but now only has 9.37-0.05=9.32 dB, and similarly, the MODCOD 174 now has 9.42-0.05=9.37 dB as its threshold. In this alternative embodiment, with the same measured SNR of 9.37 dB, the new target MODCOD will be selected as MODCOD 174.

Figure 8:
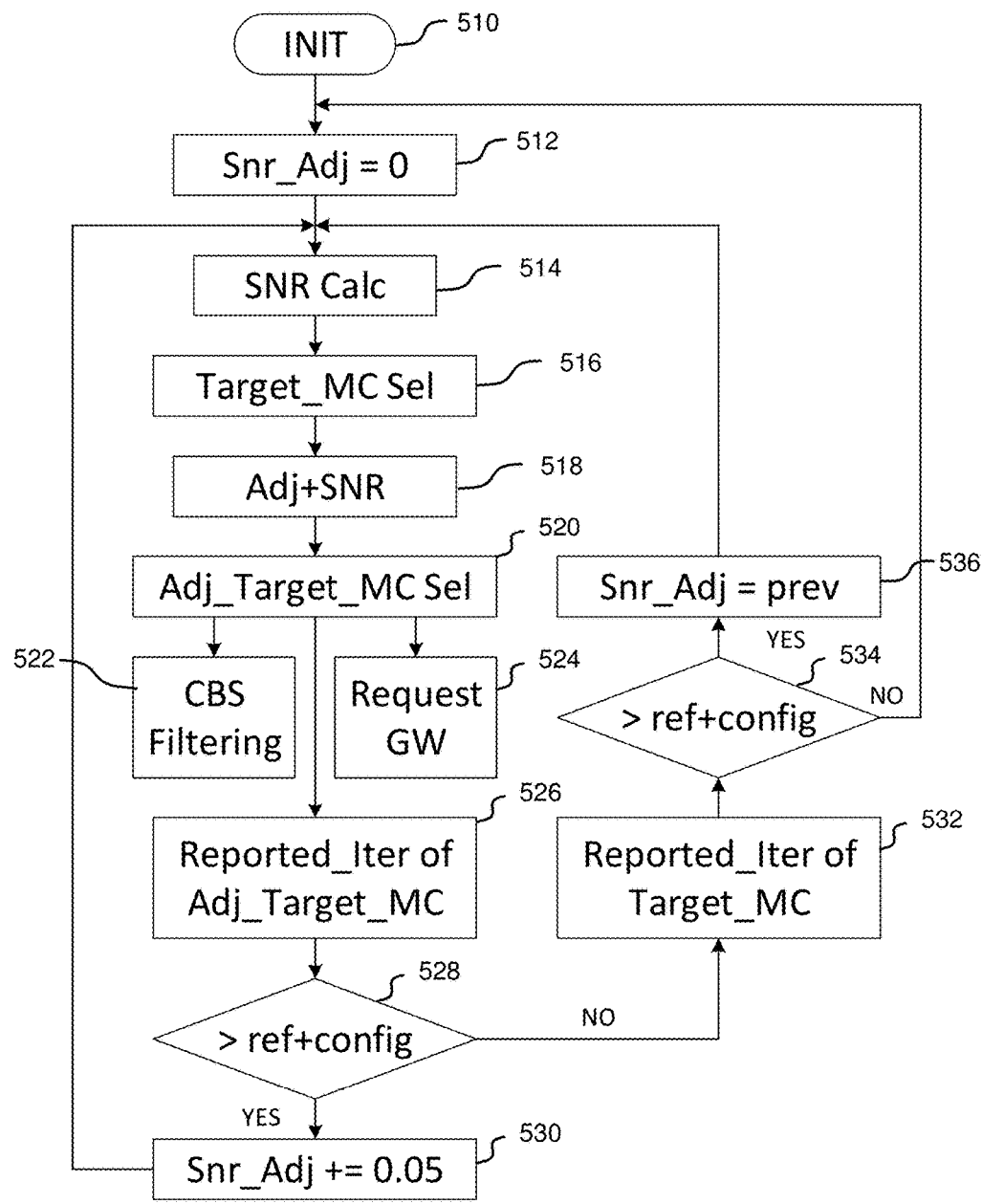

FIGS. 8 and 9 are flow diagrams illustrating an example operation of the systems and methods described in FIGS. 5, 6 and 7 in accordance with one embodiment. Referring now to FIGS. 8 and 9 at operation 510, the system is initialized. At operation 512 there are no adjustments applied. In terms of the examples illustrated in FIGS. 5-7, the ADJUST column in the ACM trajectory table 483 is cleared, or the values are set to zero. At operations 514 and 516, the SNR is estimated and the target MODCOD is selected. As shown in lines 2 and 3 of FIG. 9, in this example the SNR is estimated at 9.37 dB and the corresponding target MODCOD is 168.

At operations 518 and 520, where an adjustment is indicated in the ADJUST column in the ACM trajectory table 483, an adjusted target MODCOD is selected. As shown in lines 2 and 3 of FIG. 9, in this example, because there is no adjustment in the ADJUST column, the adjusted target MODCOD remains at 168. As shown at operations 522 and 524, the data is filtered based on the target MODCOD, and the terminal requests that the gateway transmits the frames using the target MODCOD.

The actual reported iterations are tracked and compared to the reference number of iterations stored for the selected MODCOD. This is illustrated at operations 526 and 528. In this example, as shown at lines 4 and 5 of FIG. 9, where the reported iterations for MODCOD 168 are less than the reference by a predetermined amount, the process returns to operation 512 and the SNR adjustment remains at zero. However, if the reported iterations for the selected MOD-COD 168 are greater than the reference number of iterations by more than a predetermined amount, the SNR is adjusted as shown in operation 530.

The predetermined number of iterations for MODCOD 168 in the example of FIG. 7 is 15. Where the predetermined amount of additional iterations (for hysteresis) required is 2, the reported iterations must be greater than 17 before the SNR is adjusted. In this example as shown in line 6 of FIG. 9, if the reported iterations are greater than 17 the measured SNR at the target MODCOD of 168 can be adjusted by 0.05 dB so that the adjusted SNR is 9.42 dB. In this case, in the next iteration at operations 516-520, the adjusted target MODCOD selected is now MODCOD 174 based on the SNR adjustment (line 7). Accordingly, this new adjusted target MODCOD is provided to code block Selector 322 and the operation continues.

MODCOD 174 has a predetermined reference number of iterations as 17. Therefore, at operations 526 and 528 the process checks to determine whether the reported actual iterations is greater than or less than 19 to determine whether the SNR should be adjusted again.

As shown at line 8, where the reported iterations is not greater than 19, this time the process proceeds through operations 532, 534 and 536. Here, the process checks the reported iterations for the target MODCOD to determine whether they should be adjusted. As shown in this example at line 8, if the reported iterations for MODCOD 174 are less than 19, the process checks to see if the reported iterations for MODCOD 168 are greater than or less than 17 (i.e., 15+2). If the reported iterations are greater than 17, the SNR adjustment is set at 0.05 dB and the operation returns to line 6. If the reported iterations are less than 17, there is no adjustment in the operation returns back to line 1.

However, as shown in lines 9 and 10 of FIG. 9, if the reported number of iterations is greater than 19, the SNR adjustment is 0.1 dB and the adjusted SNR is 9.47 dB is shown at line 11, with an adjusted SNR of 9.47, the adjusted target MODCOD is to be changed to account for this.

In this situation, the adjusted target MODCOD will be a new MODCOD (not listed in the table 483) with a higher SNR threshold than that of MODCOD 174. The target MODCOD will remain at MODCOD 168. The new adjusted target MODCOD also has a predetermined reference number of iterations. At operations 526 and 528 the process checks to determine whether the reported actual iterations is greater than or less than the reference iterations to determine whether the SNR should be adjusted again. The process then proceeds through operations 532, 534 and 536, i.e. repeating from line 8 (as line 12 indicates) based on the reported iteration and reference iteration of the new adjusted target MODCOD and the original target MODCOD of 168.

Figure 10:
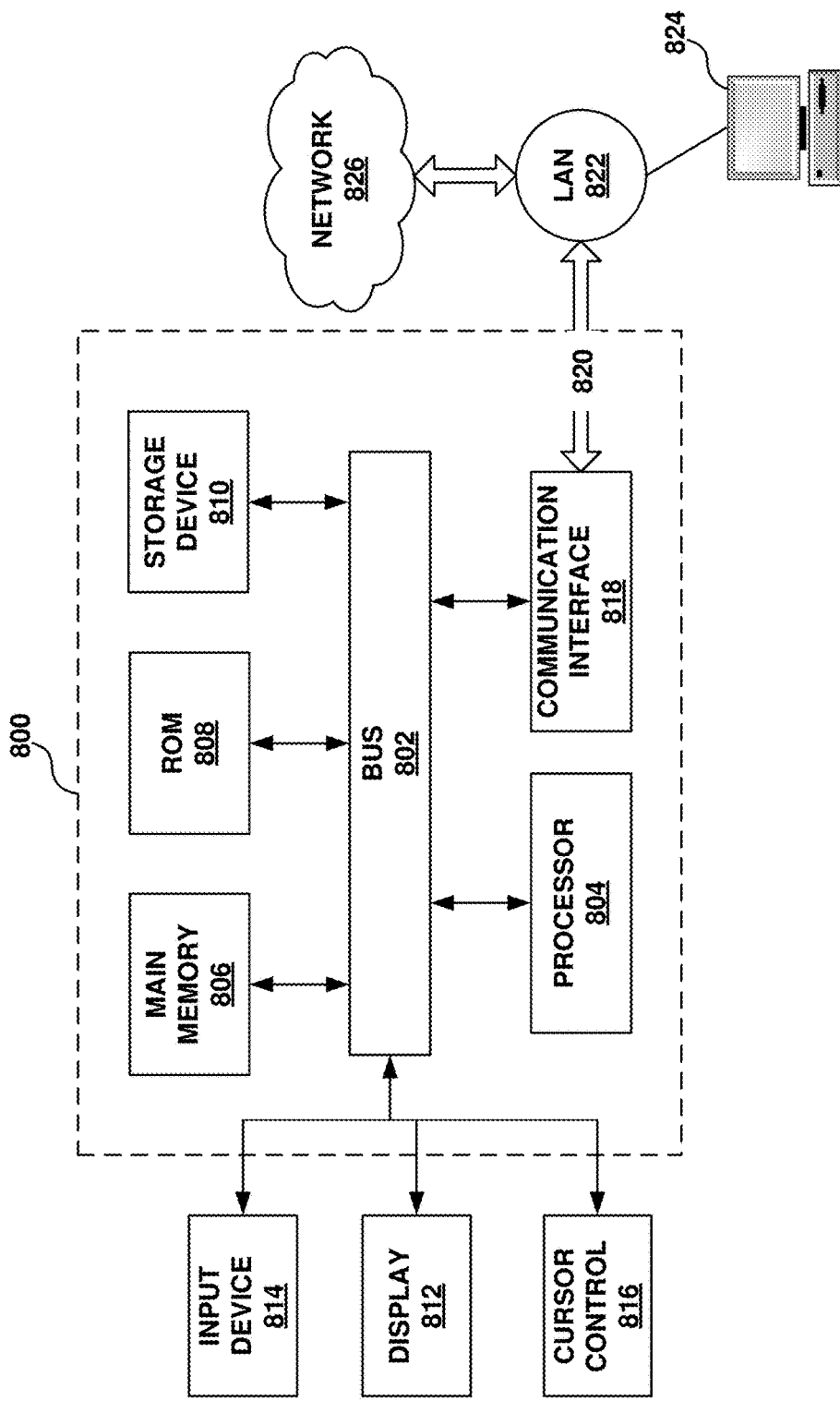
FIG. 10 illustrates an example computing module that may be used in implementing features of various embodiments.

FIG. 10 illustrates a computer system 800 upon which example embodiments according to the present disclosure can be implemented. Computer system 800 can include a bus 802 or other communication mechanism for communicating information, and a processor 804 coupled to bus 802 for processing information. Computer system 800 may also include main memory 806, such as a random access memory (RAM) or other dynamic storage device, coupled to bus 802 for storing information and instructions to be executed by processor 804. Main memory 806 can also be used for storing temporary variables or other intermediate information during execution of instructions to be executed by processor 804. Computer system 800 may further include a read only memory (ROM) 808 or other static storage device coupled to bus 802 for storing static information and instructions for processor 804. A storage device 810, such as a magnetic disk or optical disk, may additionally be coupled to bus 802 for storing information and instructions.

Computer system 800 can be coupled via bus 802 to a display 812, such as a cathode ray tube (CRT), liquid crystal display (LCD), active matrix display, light emitting diode (LED)/organic LED (OLED) display, digital light processing (DLP) display, or plasma display, for displaying information to a computer user. An input device 814, such as a keyboard including alphanumeric and other keys, may be coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812.

Processor 804 may execute an arrangement of instructions contained in main memory 806. Such instructions can be read into main memory 806 from another computer-readable medium, such as storage device 810. Execution of the arrangement of instructions contained in main memory 806 may cause processor 804 to perform one or more processes described herein. One or more processors in a multi-processing arrangement may also be employed to execute the instructions contained in main memory 806. Alternatively, hard-wired circuitry may be used in place of or in combination with software instructions to perform one or more processes described herein. Thus, the technology described in the present disclosure is not limited to any specific combination of hardware circuitry and software.

Computer system 800 may also include a communication interface 818 coupled to bus 802. Communication interface 818 can provide a two-way data communication coupling to a network link 820 connected to a local network 822. By way of example, communication interface 818 may be a digital subscriber line (DSL) card or modem, an integrated services digital network (ISDN) card, a cable modem, or a telephone modem to provide a data communication connection to a corresponding type of telephone line. As another example, communication interface 818 may be a local area network (LAN) card (e.g. for Ethernet™ or an Asynchronous Transfer Model (ATM) network) to provide a data communication connection to a compatible LAN. Wireless links can also be implemented. In any such implementation, communication interface 818 sends and receives electrical, electromagnetic, or optical signals that carry digital data streams representing various types of information. Further, communication interface 818 may include peripheral interface devices, such as a Universal Serial Bus (USB) interface, a PCMCIA (Personal Computer Memory Card International Association) interface, etc.

Network link 820 typically provides data communication through one or more networks to other data devices. By way of example, network link 820 can provide a connection through local network 822 to a host computer 824, which has connectivity to a network 826 (e.g. a wide area network (WAN) or the global packet data communication network now commonly referred to as the "Internet") or to data equipment operated by service provider. Local network 822 and network 826 may both use electrical, electromagnetic, or optical signals to convey information and instructions. The signals through the various networks and the signals on network link 820 and through communication interface 818, which communicate digital data with computer system 800, are example forms of carrier waves bearing the information and instructions.

Computer system 800 may send messages and receive data, including program code, through the network(s), network link 820, and communication interface 818. In the Internet example, a server (not shown) might transmit requested code belonging to an application program for implementing an embodiment of the present disclosure through network 826, local network 822 and communication interface 818. Processor 804 executes the transmitted code while being received and/or store the code in storage device 810, or other non-volatile storage for later execution. In this manner, computer system 800 obtains application code in the form of a carrier wave.

The term "computer-readable medium" as used herein refers to any medium that participates in providing instructions to processor 804 for execution. Such a medium may take many forms, including but not limited to non-volatile media, volatile media, and transmission media. Non-volatile media include, for example, optical or magnetic disks, such as storage device 810. Volatile media may include dynamic memory, such as main memory 806. Transmission media may include coaxial cables, copper wire and fiber optics, including the wires that comprise bus 802. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Various forms of computer-readable media may be involved in providing instructions to a processor for execution. By way of example, the instructions for carrying out at least part of the present disclosure may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Where components or modules of the application are implemented in whole or in part using software, in one embodiment, these software elements can be implemented to operate with a computing or processing module capable of carrying out the functionality described with respect thereto. One such example computing module is shown in FIG. 8. Various embodiments are described in terms of this example-computing module 800. After reading this description, it will become apparent to a person skilled in the relevant art how to implement the application using other computing modules or architectures.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the present application, whether or not such embodiments are described and whether or not such features are presented as being a part of a described embodiment. Thus, the breadth and scope of the present application should not be limited by any of the above-described exemplary embodiments.

Terms and phrases used in the present application, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A communication apparatus comprising:
 a demodulator;
 a MODCOD determination block comprising an input coupled to a demodulator and an output, wherein the MODCOD determination block is configured to determine a selected MODCOD for receiver operation using a SNR determined for received data;
 a memory associated with the MODCOD determination block to store trajectory data comprising available MODCODs and a threshold SNR value for the available MODCODs;
 a decoder comprising an input coupled to an output of the demodulator;

a memory associated with the decoder to store a reference number of decoder iterations used to decode data using the selected MODCOD and an actual number of decoder iterations used to decode data using the selected MODCOD;

wherein the decoder is configured to adjust the threshold SNR value for the selected MODCOD if the number of iterations used to decode the data using the first selected MODCOD is greater than the reference number of iterations.

2. The communication apparatus of claim 1, further comprising a SNR estimation block having an input coupled to the demodulator and an output coupled to the MODCOD determination block, the SNR estimation block being configured to determine a signal-to-noise ratio (SNR) for the received data.

3. The communication apparatus of claim 2, wherein determining the selected MODCOD comprises determining a MODCOD that will operate under the determined SNR.

4. The communication apparatus of claim 1, wherein the threshold SNR for each MODCOD corresponds to a threshold Frame Error Rate specified by a network over which the data is received.

5. The communication apparatus of claim 1, wherein the memory associated with the MODCOD determination block further comprises an SNR adjustment amount, and adjusting a SNR for the selected MODCOD comprises modifying an SNR adjustment amount in the table of two or more available MODCODs.

6. The communication apparatus of claim 1, wherein the memory associated with the MODCOD determination block further comprises an SNR adjustment amount, and adjusting a SNR for the selected MODCOD comprises shifting the SNR threshold values of two or more available MODCODs by a determined amount.

7. The communication apparatus of claim 1, wherein determining the selected MODCOD comprises determining a MODCOD that will operate under the determined SNR using one or more adjusted SNR threshold values for one or more available MODCODs.

8. The communication apparatus of claim 1, wherein adjusting a SNR for the selected MODCOD where the number of iterations used to decode the data using the first selected MODCOD is greater than the reference number of iterations by a predetermined number of iterations.

9. The communication apparatus of claim 8, wherein the predetermined number of iterations is one, two or three.

10. The communication apparatus of claim 1, further comprising a code block selector comprising an input coupled to the demodulator and an output coupled to the decoder, where in the code block selector is configured to filter the received code blocks based on the selected MODCOD.

11. The communication apparatus of claim 1, wherein adjusting the threshold SNR value for the selected MODCOD comprises further storing in the memory an SNR adjustment value for the selected MODCOD.

12. The communication apparatus of claim 1, wherein adjusting the threshold SNR value for the selected MODCOD comprises adjusting the value stored for the SNR threshold of the selected MODCOD.

* * * * *